US012760442B2

(12) United States Patent
M'Saad et al.

(10) Patent No.: US 12,760,442 B2
(45) Date of Patent: Oct. 13, 2026

(54) WAFER TEMPERATURE GRADIENT CONTROL TO SUPPRESS SLIP FORMATION IN HIGH-TEMPERATURE EPITAXIAL FILM GROWTH

(71) Applicant: ASM IP Holding B.V., Almere (NL)

(72) Inventors: Hichem M'Saad, Paradise Valley, AZ (US); Alexandros Demos, Scottsdale, AZ (US); Xing Lin, Chandler, AZ (US); Junwei Su, Tempe, AZ (US); Matthew Goodman, Chandler, AZ (US); Daw Gen Lim, Tempe, AZ (US); Shujin Huang, Tempe, AZ (US); Rutvij Naik, Tempe, AZ (US)

(73) Assignee: ASM IP Holding B.V., Almere (NL)

( * ) Notice: Subject to any disclaimer, the term of this patent is extended or adjusted under 35 U.S.C. 154(b) by 991 days.

(21) Appl. No.: 17/697,107

(22) Filed: Mar. 17, 2022

(65) Prior Publication Data

US 2022/0298672 A1 Sep. 22, 2022

Related U.S. Application Data

(60) Provisional application No. 63/270,653, filed on Oct. 22, 2021, provisional application No. 63/162,878, filed on Mar. 18, 2021.

(51) Int. Cl.
*C30B 25/16* (2006.01)
*C23C 14/54* (2006.01)
(Continued)

(52) U.S. Cl.
CPC ............ *C30B 25/16* (2013.01); *C23C 14/541* (2013.01); *C23C 16/46* (2013.01); *C23C 16/52* (2013.01);
(Continued)

(58) Field of Classification Search
CPC ............... H01L 22/20; H01L 21/67115; H01L 21/67242; H01L 21/67248;
(Continued)

(56) References Cited

U.S. PATENT DOCUMENTS 4,749,440 A 6/1988 Blackwood et al.
4,997,490 A 3/1991 Vetter et al.
(Continued)

FOREIGN PATENT DOCUMENTS

CN 102191485 A 9/2011
CN 103308182 A 9/2013
(Continued)

OTHER PUBLICATIONS

Wessapan, Teerapot, et al., "Temperature induced in human organs due to near-field and far-field electromagnetic exposure effects". International Journal of Heat and Mass Transfer 119 (2018) 65-76.
(Continued)

*Primary Examiner* — Sang Y Paik
(74) *Attorney, Agent, or Firm* — Snell & Wilmer L.L.P.

(57) ABSTRACT

A method of operating a reactor system to provide wafer temperature gradient control is provided. The method includes operating a center temperature sensor, a middle temperature sensor, and an edge temperature sensor to sense a temperature of a center zone of a wafer on a susceptor in reaction chamber of the reactor system, to sense a temperature of a middle zone of the wafer, and to sense a temperature of an edge zone of the wafer. The temperatures of the center, middle, and edge zones of the wafer are processed with a controller to generate control signals based on a predefined temperature gradient for the wafer. First, second, and third sets of heater lamps are operated based on the
(Continued)

temperature of the center, middle, and edge zones to heat the center, the middle, and the edge zone of the wafer. Reactor systems are also described.

20 Claims, 7 Drawing Sheets

(51) Int. Cl.

| | |
|---|---|
| ***C23C 16/46*** | (2006.01) |
| ***C23C 16/52*** | (2006.01) |
| ***C30B 23/06*** | (2006.01) |
| ***C30B 25/10*** | (2006.01) |
| ***C30B 25/12*** | (2006.01) |
| ***F27B 17/00*** | (2006.01) |
| ***G01J 5/00*** | (2022.01) |
| ***H01L 21/66*** | (2006.01) |
| ***H05B 1/02*** | (2006.01) |
| ***H05B 3/00*** | (2006.01) |
| ***H10P 74/00*** | (2026.01) |

(52) U.S. Cl.
CPC ............ *C30B 23/063* (2013.01); *C30B 25/10* (2013.01); *C30B 25/12* (2013.01); *F27B 17/0025* (2013.01); *G01J 5/0007* (2013.01); *H05B 1/0233* (2013.01); *H05B 3/0047* (2013.01); *H10P 74/23* (2026.01)

(58) Field of Classification Search
CPC ............ H01L 21/67259; H05B 1/0233; H05B 3/0047; G01J 5/0007; G01J 5/485; F27B 17/0025; C30B 23/063; C30B 25/10; C30B 25/12; C30B 25/16; C23C 14/541; C23C 16/46; C23C 16/482; C23C 16/52
USPC ....................................................... 219/444.1
See application file for complete search history.

(56) References Cited

U.S. PATENT DOCUMENTS 5,155,336 A * 10/1992 Gronet ................ F27D 99/0033 219/390
5,231,595 A * 7/1993 Makino ..................... G01J 5/60 250/339.04
5,305,417 A * 4/1994 Najm ...................... C30B 25/10 118/724
5,785,820 A 7/1998 Hoffman et al.
5,928,426 A 7/1999 Aitchison
6,065,481 A 5/2000 Fayfield et al.
6,079,874 A * 6/2000 Hegedus ........... H01L 21/67115 118/725
6,092,539 A 7/2000 Chang et al.
6,215,106 B1 4/2001 Boas et al.
6,221,168 B1 4/2001 Carter et al.
6,277,204 B1 8/2001 Chang et al.
6,348,420 B1 2/2002 Raaijmakers et al.
6,492,625 B1 * 12/2002 Boguslavskiy ... H01L 21/68764 219/486
6,536,964 B1 3/2003 Kitano et al.
6,596,973 B1 7/2003 Donald et al.
6,631,788 B2 10/2003 Shikai et al.
6,640,604 B2 * 11/2003 Matsushita ............ B21D 11/20 72/38
6,799,137 B2 * 9/2004 Schietinger ............ A61B 17/34 374/E11.003
7,198,997 B2 4/2007 Shiono et al.
7,543,981 B2 6/2009 Timans
7,651,956 B1 1/2010 Mercaldi et al.
7,921,802 B2 4/2011 De
7,964,038 B2 6/2011 Patalay et al.
8,283,607 B2 10/2012 Ranish et al.
8,895,395 B1 11/2014 Kerber et al.
8,969,934 B1 3/2015 Cheng et al.
9,031,685 B2 5/2015 Chin et al.
9,034,770 B2 5/2015 Park et al.
9,093,269 B2 7/2015 Cody et al.
9,093,390 B2 7/2015 Wang et al.
9,299,557 B2 3/2016 Tolle et al.
9,474,163 B2 10/2016 Tolle et al.
9,512,520 B2 12/2016 Sanchez et al.
9,514,927 B2 12/2016 Tolle et al.
9,570,298 B1 2/2017 Basker et al.
9,576,788 B2 2/2017 Liu et al.
9,683,308 B2 6/2017 Olsen et al.
9,757,878 B2 9/2017 Feuilloley et al.
9,870,921 B2 1/2018 Olsen et al.
9,887,096 B2 2/2018 Park et al.
9,905,420 B2 2/2018 Margetis et al.
10,153,172 B2 12/2018 Sako
10,196,664 B2 2/2019 Weterings et al.
10,373,850 B2 8/2019 Tolle et al.
10,519,541 B2 12/2019 Tolle et al.
10,566,187 B2 2/2020 Qian et al.
10,861,693 B2 12/2020 Stone et al.
11,227,959 B2 1/2022 Siegmund et al.
12,112,938 B2 10/2024 Wei et al.
2001/0051128 A1 12/2001 Hoffman et al.
2002/0062845 A1 5/2002 Kawai et al.
2003/0119283 A1 * 6/2003 Ishibashi ............. C23C 16/4585 438/503
2005/0126030 A1 6/2005 Ohmi et al.
2006/0004493 A1 1/2006 Hwang et al.
2006/0112974 A1 6/2006 Isago et al.
2007/0015360 A1 1/2007 Lu et al.
2007/0212510 A1 9/2007 Hieslmair et al.
2008/0090193 A1 4/2008 Soanes
2009/0101633 A1 * 4/2009 Aggarwal ........... F27B 17/0025 219/385
2010/0133257 A1 6/2010 Sorabji et al.
2011/0149062 A1 6/2011 Campidell et al.
2011/0205688 A1 8/2011 Ray et al.
2011/0266252 A1 11/2011 Thandani et al.
2011/0299898 A1 12/2011 Ito et al.
2012/0160828 A1 6/2012 Bowman et al.
2012/0237695 A1 9/2012 Pye et al.
2012/0270384 A1 10/2012 Sanchez et al.
2013/0052333 A1 2/2013 Lindow et al.
2013/0130184 A1 5/2013 Lu et al.
2013/0171350 A1 7/2013 Kraus et al.
2014/0030859 A1 1/2014 Xie et al.
2015/0184313 A1 7/2015 Yoshitake et al.
2015/0217517 A1 8/2015 Karpas et al.
2015/0330837 A1 11/2015 Liberti et al.
2016/0027671 A1 1/2016 Ranish et al.
2016/0027674 A1 1/2016 Griffin et al.
2016/0068955 A1 3/2016 Brillhart et al.
2016/0133504 A1 5/2016 Chu
2016/0307771 A1 10/2016 Xu et al.
2017/0074727 A1 3/2017 Liu et al.
2017/0074737 A1 3/2017 Hamabe et al.
2017/0101712 A1 * 4/2017 Bansal .............. C23C 16/45565
2017/0170014 A1 6/2017 Basker et al.
2017/0178917 A1 6/2017 Kamp et al.
2017/0194430 A1 7/2017 Wood et al.
2017/0278761 A1 9/2017 Devilliers
2018/0182597 A1 6/2018 Blomberg et al.
2018/0195174 A1 7/2018 Kim et al.
2018/0350619 A1 12/2018 Chen et al.
2019/0027605 A1 1/2019 Tolle et al.
2019/0112709 A1 4/2019 Arkles et al.
2019/0123174 A1 4/2019 Mochizuki et al.
2019/0127851 A1 5/2019 Lau et al.
2019/0185990 A1 6/2019 Zhao
2019/0221458 A1 7/2019 Lu et al.
2019/0333793 A1 10/2019 Tolle et al.
2019/0348261 A1 11/2019 Lin et al.
2020/0080894 A1 3/2020 Leow et al.
2020/0115800 A1 4/2020 Ohkawa
2020/0118336 A1 4/2020 Oyanagi et al.
2020/0118836 A1 4/2020 Ding et al.
2020/0203149 A1 6/2020 Huang et al.

(56) References Cited

U.S. PATENT DOCUMENTS

| | | | |
|---|---|---|---|
| 2020/0234968 A1 | 7/2020 | Zhang et al. | |
| 2020/0294794 A1 | 9/2020 | Haberecht et al. | |
| 2021/0125853 A1* | 4/2021 | Rathi | H01L 21/67115 |
| 2021/0257260 A1 | 8/2021 | Chu et al. | |
| 2021/0366722 A1 | 11/2021 | Lei et al. | |
| 2022/0130668 A1 | 4/2022 | Tolle et al. | |
| 2022/0298643 A1 | 9/2022 | Kajbafvala et al. | |
| 2022/0301856 A1 | 9/2022 | Wei et al. | |
| 2022/0386417 A1 | 12/2022 | Taniguchi | |
| 2024/0429038 A1 | 12/2024 | Wei et al. | |

FOREIGN PATENT DOCUMENTS

| | | | |
|---|---|---|---|
| CN | 106637145 | A | 5/2017 |
| JP | H06104252 | A | 4/1994 |
| JP | 2010062197 | A | 3/2010 |
| JP | 2011187637 | A | 9/2011 |
| KR | 20140105974 | A | 9/2014 |
| TW | 201415541 | A | 4/2014 |
| WO | 2013176453 | A1 | 11/2013 |
| WO | 2013192510 | A1 | 12/2013 |

OTHER PUBLICATIONS

Brar, Victor W., et al., "Electronic modulation of infrared radiation in graphene plasmonic resonators". Nature Communications, 6:7032, May 2015, pp. 1-7.

Zhao, Zengyue et al., "Selectively thermal radiation control in long-wavelength infrared with broadband all-dielectric absorber". Optics Express, vol. 27, No. 24/25, Nov. 2019, 35088-35095.

Nycz, Andrzej, et al., "Controlling substrate temperature with infrared heating to improve mechanical properties of large-scale printed parts". Additive Manufacturing 33 (2020) 101068, pp. 1-10.

Zhang, Xia, et al., "Controlling Thermal Emission by Parity-Symmetric Fano Resonance of Optical Absorbers in Metasurfaces." ACS Photonics 2019, 6, 2671-2676.

Khan, Shahrukh, et al., "Comparative accuracy testing of non-contact infrared thermometers and temporal artery thermometers inan adult hospital setting". American Journal of Infection Control 49 (2021) 597-602.

Chou, Ming-Dah, et al., "A Parameterization of the Effective Layer Emission for Infrared Radiation Calculations". Journal of the Atmospheric Sciences, vol. 62, Feb. 2005, pp. 531-541.

* cited by examiner

WAFER TEMPERATURE GRADIENT CONTROL TO SUPPRESS SLIP FORMATION IN HIGH-TEMPERATURE EPITAXIAL FILM GROWTH

CROSS-REFERENCE TO RELATED APPLICATIONS

This application claims priority to and the benefit of U.S. Provisional Patent Application No. 63/162,878, filed Mar. 18, 2021 and entitled "FILM DEPOSITION SYSTEMS AND METHODS," and U.S. Provisional Patent Application No. 63/270,653, filed Oct. 22, 2021 and entitled "WAFER TEMPERATURE GRADIENT CONTROL TO SUPPRESS SLIP FORMATION IN HIGH-TEMPERATURE EPITAXIAL FILM GROWTH," which are hereby incorporated by reference herein to the extent that they do not conflict with the present disclosure.

FIELD OF THE DISCLOSURE

The present disclosure relates generally to methods and systems for controlling wafer temperatures in a semiconductor processing or reactor system, and, more particularly, to methods and apparatus for controlling actual wafer temperature at different locations on the wafer, and use in heating controls, of temperature gradients of wafers in a semiconductor processing or reactor system.

BACKGROUND OF THE DISCLOSURE

Semiconductor processing, including chemical vapor deposition (CVD), is a well-known process for forming thin films of materials on substrates, such as silicon wafers. In a CVD process, for example, gaseous molecules of the material to be deposited are supplied to wafers to form a thin film of that material on the wafers by chemical reaction. Such formed thin films may be polycrystalline, amorphous, or epitaxial. Typically, CVD processes are conducted at elevated temperatures to accelerate the chemical reaction and to produce high quality films, with some of these processes, such as epitaxial silicon deposition or epitaxial (EPI) growth, being conducted at high temperatures (e.g., greater than 900° C.).

During a typical CVD process, one or more wafers are placed on a wafer support (or "susceptor") inside a chamber (or "reaction chamber") within the reactor. Both the wafer and the susceptor are heated to a desired temperature. In a typical wafer treatment step, reactant gases are passed over the heated wafer causing deposition of a thin layer of a desired material on the wafer's surface. If the deposited layer has the same crystallographic structure as the underlying silicon wafer, it is called an epitaxial or EPI layer (or a monocrystalline layer because it has only one crystal structure). Through subsequent processes, these layers are made into integrated circuits.

To ensure high quality layers during CVD and other deposition processes, various process parameters must be carefully controlled, with the temperature of the wafer during each treatment step being one of the more critical. During CVD, for example, the wafer temperature dictates the rate of material deposition on the wafer because the deposition gases react at particular temperatures and deposit on the wafer. If the temperature varies across the surface of the wafer (e.g., a non-uniform temperature gradient), uneven deposition of the film may occur and the physical properties may not be uniform over the wafer surface. Furthermore, in epitaxial deposition, even slight temperature nonuniformity can result in undesirable crystallographic slip. In the semiconductor industry, it is important that the material be deposited uniformly thick with uniform properties over the wafer, as the wafer is often divided into individual chips having integrated circuits thereon. If a CVD process or other deposition step produces deposited layers with nonuniformities, devices at different areas on the chips may have inconsistent operation characteristics or may fail altogether.

To achieve the desired temperatures, wafers (or substrates) are heated using resistance heating, induction heating, or radiant heating. Since radiant heating is the most efficient technique, it is presently the favored method for many types of deposition processes including CVD processes. Radiant heating involves positioning infrared lamps around or in reaction chambers or reactors, with the lamps often being provided in a lamp bank adjacent the surface of the wafer or substrate upon which material is to be deposited. One problem, though, with use of radiant heat can, in some deposition processes, create nonuniform temperature distributions or temperature gradients along the wafer surface including hot spots due to the use of localized radiant energy sources or lamps and consequent focusing and interference effects.

FIG. 1 illustrates a conventional arrangement for CVD and other deposition processes within a reaction chamber 100. As shown, a wafer 110 is located on a susceptor 120, with its edges supported by and in abutting contact with the susceptor ledge 122. During epitaxial growth, for example, the wafer 110 and the susceptor 120 are heated up by thermal radiation while the susceptor 120 and received wafer 110, spaced apart from the pocket 140, are rotated by rotation of a support shaft 130 about a rotation axis extending through the center of this shaft 130 and the wafer 110. Since the contact area between the wafer edge and susceptor ledge 122 is at the far edge of the wafer 110, the temperature distribution is typically nonuniform (or a temperature gradient is produced) with the center wafer temperature, T-Wafer Center, differing from the wafer edge temperature, T-Wafer Edge. If such a temperature gradient is large enough, it can impact the quality of a grown epitaxial film such as by producing slip defects and achieving poor thickness or resistivity uniformity.

Slip is a crystallographic shift of the atomic layers caused by tensile stress that exceeds the wafer's yield strength. The presence of slip dislocations in a wafer is detrimental because these dislocations can cause wafer warpage, which results in pattern misalignment substrate leakage from devices. Dislocation networks are caused by an undesirable large temperature gradient across a wafer's upper surface during EPI growth and other deposition processes. For example, in a typical p/p-epitaxial wafer, slip can be produced above 1050° C. The length and density of slip strongly depends on EPI deposition temperatures and time, with thermal stress-induced slip often depending strongly on the temperature variation within a wafer.

Further, as semiconductor device geometries progressively become smaller, semiconductor device fabrication becomes increasingly less tolerant of center to edge temperature variation. For example, in gate-all-around (GAA) semiconductor device architectures, epitaxial films may be employed to the define the channel portion of transistor devices formed on the wafer. As a consequence, characteristics of the epitaxial film potentially influenced by temperature variation can, in turn, influence performance characteristics of GAA transistor devices, such as speed and electrical characteristics such as capacitance. For this reason, it can be necessary that thickness variation across the wafer be smaller than previously required, for example, less than 1.5 A or approaching monolayer control. Since epitaxial film deposition is a thermal process meaning that growth characteristics depend on the temperature of the process, an accurate control of wafer temperature at all points of the wafer is necessary.

Such systems and methods have been acceptable for their intended purpose. However, there remains a need for improved methods of operating a reactor systems. The present disclosure provided a solution to this need.

SUMMARY OF THE DISCLOSURE

This summary is provided to introduce a selection of concepts in a simplified form. These concepts are described in further detail in the detailed description of examples of the disclosure below. This summary is not intended to identify key features or essential features of the claimed subject matter, nor is it intended to be used to limit the scope of the claimed subject matter.

A method of operating a reactor system to provide wafer temperature gradient control is provided. The method includes operating a center temperature sensor, a middle temperature sensor, and an edge temperature sensor to sense a temperature of a center zone of a wafer on a susceptor in reaction chamber of the reactor system, to sense a temperature of a middle zone of the wafer, and to sense a temperature of an edge zone of the wafer. The temperatures of the center, middle, and edge zones of the wafer are processed with a controller to generate control signals based on a predefined temperature gradient for the wafer. A first set of heater lamps is operated based on the temperature of the center zone to heat the center zone of the wafer, a second set of heater lamps is operated based on the temperature of the middle zone to heat the middle zone of the wafer, and a third set of heater lamps is operated based on the temperature of the edge zone to heat the edge zone of the wafer.

In addition to one or more of the features described above, or as an alternative, further examples of the method may include that the center, middle, and edge temperature sensors each include a pyrometer receiving electromagnetic radiation from respective spots on the wafer to sense the center, middle, and edge zone temperatures.

In addition to one or more of the features described above, or as an alternative, further examples of the method may include that the spot associated with the center temperature sensor has a center point within a radial offset of less than 40 millimeters from the center of the wafer, that the spot associated with the edge temperature sensor has a center point at a radial offset in the range of 1 to 10 millimeters from the edge of the wafer, and that the spot associated with the middle temperature sensor has a center point at a location on the wafer disposed between the spots associated with the center and edge temperature sensors.

In addition to one or more of the features described above, or as an alternative, further examples of the method may include that the pyrometer of the edge temperature sensor is configured with an outlet of a lens tube at a distance from the wafer such that the spot associated with the edge temperature sensor has an outer diameter in the range of 1 to 10 millimeters.

In addition to one or more of the features described above, or as an alternative, further examples of the method may include that the predefined temperature gradient for the wafer is defined by setpoint temperatures for the center, middle, and edge zones of the wafer.

In addition to one or more of the features described above, or as an alternative, further examples of the method may include that the processing of the temperatures by the controller comprises closed-loop control including comparing the temperatures of the center, middle, and edge zones read by the center, middle, and edge temperature sensors with the setpoint temperatures.

In addition to one or more of the features described above, or as an alternative, further examples of the method may include that the operating of the heater lamps includes providing variable proportional control over electric power provided to each lamp in the first, second, and third sets of heater lamps based on the control signals.

In addition to one or more of the features described above, or as an alternative, further examples of the method may include that the first set of heater lamps comprises three center linear lamps in an upper lamp bank, that the third set of heater lamps comprises two pair of outer linear lamps in the upper lamp bank, that the second set of heater lamps comprises linear lamps in the upper lamp bank disposed between the linear lamps in the first and third sets of heater lamps, and that the linear lamps within each of the first, second, and third sets are provided matching levels of electric power based on the control signals.

A reactor system for providing wafer temperature gradient control is provided. The reactor system includes a reaction chamber with a susceptor therein for supporting a wafer, two or more heat lamps operable to direct heat into the reaction chamber and onto the wafer, a temperature monitoring assembly including at least three pyrometers reading temperatures in a center zone, a middle zone, and an edge zone of the wafer, and a controller controlling the plurality of heat lamps based on the temperatures of the center, middle, and edge zones to provide the heat to control a temperature gradient from a center to an edge of the wafer.

In addition to one or more of the features described above, or as an alternative, further examples of the reactor system may include that the temperature monitoring assembly comprises an edge pyrometer receiving electromagnetic radiation emitted from within a sensor spot on an upper surface of the wafer with an outer diameter in the range of 1 to 10 millimeters.

In addition to one or more of the features described above, or as an alternative, further examples of the reactor system may include that the sensor spot is centered at a radial offset from the edge of the wafer in the range of 1 to 10 millimeters.

In addition to one or more of the features described above, or as an alternative, further examples of the reactor system may include that the susceptor has a concavity in the range of 0.15 to 0.30 millimeters.

In addition to one or more of the features described above, or as an alternative, further examples of the reactor system may include that the controller generates control signals to provide electric power to a first set of the heat lamps to heat the center zone of the wafer, a second set of the heat lamps to heat the middle zone of the wafer, and a third set of the heat lamps to heat the edge zone of the wafer.

In addition to one or more of the features described above, or as an alternative, further examples of the reactor system may include that the control signals set levels of the electric power provided to the first, second, and third set of the heat lamps based on a comparison of the temperatures in the center zone, the middle zone, and the edge zone of the wafer to setpoint temperatures for the center zone, the middle zone, and the edge zone of the wafer.

In addition to one or more of the features described above, or as an alternative, further examples of the reactor system may include that the first set of heat lamps comprises three center linear lamps in an upper lamp bank, wherein the third set of heat lamps comprises two pair of outer linear lamps in the upper lamp bank, that the second set of heat lamps comprises linear lamps in the upper lamp bank disposed between the linear lamps in the first and third sets of heat lamps, and that differing levels of electric power are provided to at least the first and third sets of heat lamps to control the temperature gradient.

Another reactor system for providing wafer temperature gradient control is provided. The reactor system includes a susceptor for supporting a wafer, two or more heat lamps operable to heat the wafer, and a temperature monitoring assembly. The temperature monitoring assembly includes a center pyrometer, a middle pyrometer, and an edge pyrometer for sensing, respectively, a temperature in a center zone of the wafer, a temperature in a middle zone of the wafer, and a temperature in an edge zone of the wafer. A controller operates the two or more heat lamps based on the temperatures of the center, middle, and edge zones to control a temperature gradient from a center to an edge of the wafer, the controller generates control signals to independently operate a first set of the heat lamps to heat the center zone of the wafer, a second set of the heat lamps to heat the middle zone of the wafer, and a third set of the heat lamps to heat the edge zone of the wafer.

In addition to one or more of the features described above, or as an alternative, further examples of the reactor system may include that the control signals proportionally set amounts of electric power provided to the first, second, and third set of the heat lamps based on a comparison of the temperatures in the center zone, the middle zone, and the edge zone of the wafer to setpoint temperatures for the center zone, the middle zone, and the edge zone of the wafer.

In addition to one or more of the features described above, or as an alternative, further examples of the reactor system may include that the temperature monitoring assembly includes an edge pyrometer receiving electromagnetic radiation emitted from a sensor spot on the upper surface of the wafer with an outer diameter in the range of 1 to 10 millimeters.

In addition to one or more of the features described above, or as an alternative, further examples of the reactor system may include that the sensor spot is centered at a radial offset from the edge of the wafer in the range of 1 to 10 millimeters.

In addition to one or more of the features described above, or as an alternative, further examples of the reactor system may include that the susceptor has a concavity in the range of 0.15 to 0.30 millimeters.

All of these examples are intended to be within the scope of the disclosure. These and other examples will become readily apparent to those skilled in the art from the following detailed description of certain examples having reference to the attached figures, the disclosure not being limited to any particular example(s) discussed.

BRIEF DESCRIPTION OF THE DRAWING FIGURES

While the specification concludes with claims particularly pointing out and distinctly claiming what are regarded as examples of the disclosure, the advantages of examples of the disclosure may be more readily ascertained from the description of certain examples of the examples of the disclosure when read in conjunction with the accompanying drawings. Elements with the like element numbering throughout the figures are intended to be the same.

DETAILED DESCRIPTION

Figure 1:
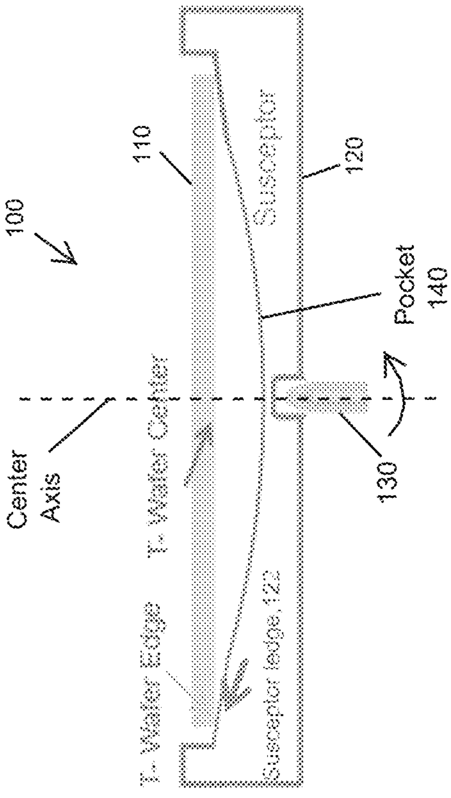
FIG. 1 Prior Art
FIG. 1 is a simplified cross-sectional view of a portion of a reaction chamber with a conventional layout with a susceptor supporting a wafer during deposition processes.

Although certain examples and examples are disclosed below, it will be understood by those in the art that the disclosure extends beyond the specifically disclosed examples and/or uses of the disclosure and obvious modifications and equivalents thereof. Thus, it is intended that the scope of the disclosure should not be limited by the particular examples described herein.

The illustrations presented herein are not meant to be actual views of any particular material, apparatus, structure, or device, but are merely representations that are used to describe examples of the disclosure.

As used herein, the terms "wafer" and "substrate" may be used interchangeably to refer to any underlying material or materials that may be used, or upon which, a device, a circuit, or a film may be formed.

As used herein, the term "chemical vapor deposition" (CVD) may refer to any process wherein a substrate is exposed to one or more volatile precursors, which react and/or decompose on a substrate surface to produce a desired deposition.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As described in greater detail below, various details and examples of the disclosure may be utilized in conjunction with a reaction chamber configured for a multitude of deposition processes, including but not limited to, ALD, CVD, metalorganic chemical vapor deposition (MOCVD), molecular beam epitaxy (MBE), and physical vapor deposition (PVD). The examples of the disclosure may also be utilized in semiconductor processing systems configured for processing a substrate with a reactive precursor, which may also include etch processes, such as, for example, reactive ion etching (ME), capacitively coupled plasma etching (CCP), and electron cyclotron resonance etching (ECR).

The inventors recognized the importance of sensing and monitoring the temperature of the temperature gradient of a wafer in real-time and controlling a heating assembly using the real-time temperatures of the wafer to achieve a desired temperature gradient. This includes monitoring wafer temperatures in three (or more) zones including a far edge zone of a wafer during deposition processes to form thin films (e.g., during epitaxial growth or the like), and, then, using feedback of temperature from each zone to adjust operations of heating lamps in or associated with each zone to maintain desired temperatures on the wafer's upper or deposition surface.

Figure 2:
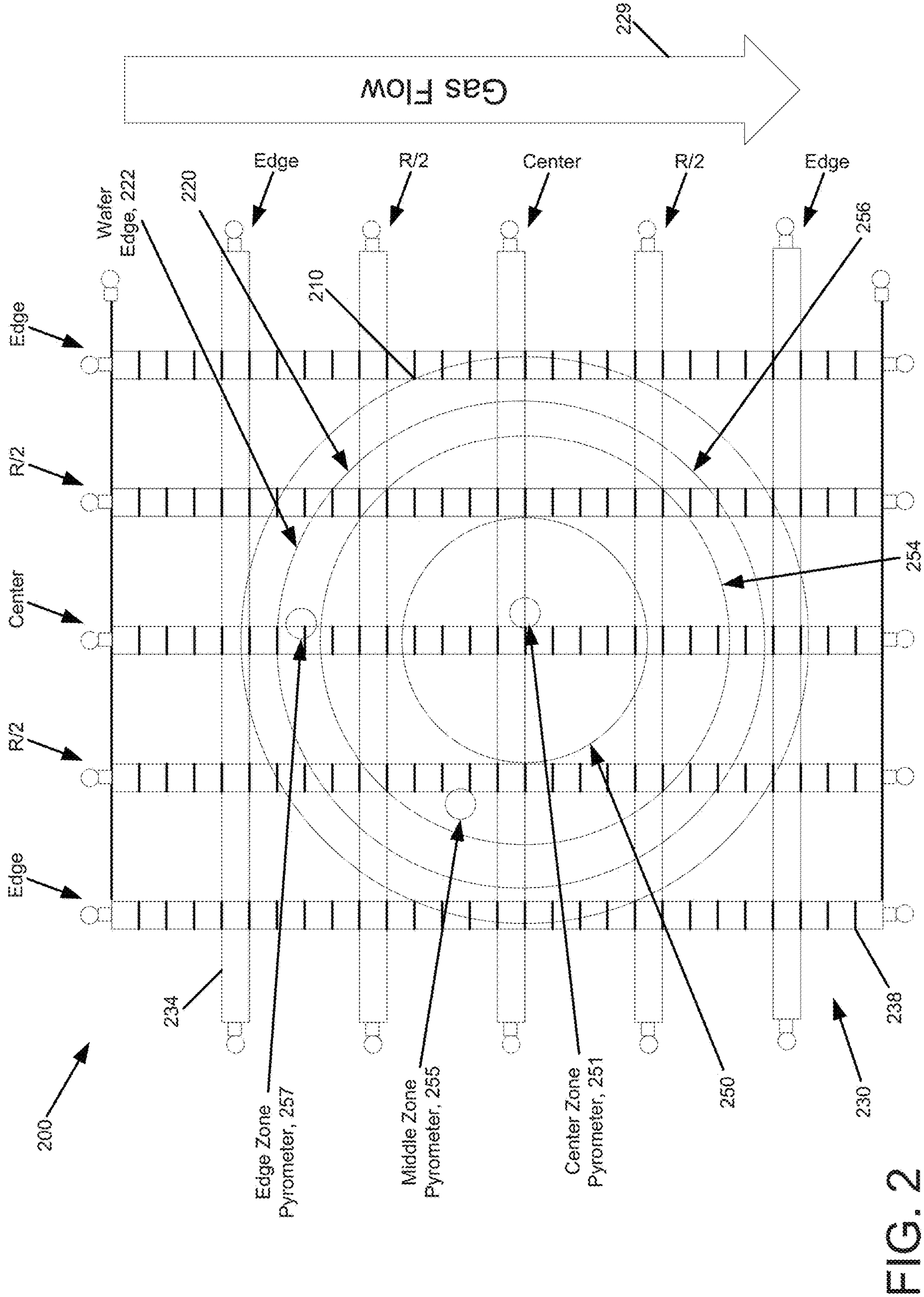
FIG. 2 is a schematic and partial top view of reactor system showing a portion of a reaction chamber and its heating assembly along with temperature monitoring assembly of the present description.

FIG. 2 illustrates a reactor system 200 using a simplified schematic top view showing a portion of components that may be provided within and adjacent to a reaction chamber configured for epitaxial (EPI) growth or other deposition processes. The system 200 is designed to achieve real-time multi-zone wafer temperature control (e.g., with a closed-loop controller design). Within the inner chamber of the reaction chamber of system 200, a susceptor 210 is provided for supporting (and, typically, rotating) a wafer 220. The system 200 is configured according to this description to have the capability to provide real-time temperature gradient control between the wafer center and the wafer edge 222 so as to reduce or better control slip formation during deposition on the wafer 220. During deposition processes, gas flow of precursors, reactants, the like flows over the wafer 220 positioned within the reaction chamber as shown by arrow 229.

To control temperatures of the wafer 220, the system 200 includes a chamber heating assembly 230 with a bottom or lower bank or array 234 and a top or upper bank or array 238 of heat lamps. The lamps may take a variety of forms and shapes to implement the system 200 including spot and/or linear lamps that may provide light energy or signals using light emitting diodes, filaments, or other technologies. As shown, for example, the bottom and top banks 234, 238 each include a plurality of linear lamps, with 11 shown in each bank 234, 238, arranged in spaced-apart planes below and above the susceptor 210 and wafer 220. The lamps are arranged in each bank/array 234, 238 to be parallel to each other with a uniform spacing between adjacent pairs.

A temperature monitoring assembly is provided that includes a center (e.g., proximate or at a rotation axis of the wafer) zone pyrometer 251, a middle (e.g., radially intermediate) zone pyrometer 255, and an edge (e.g., radially outer) zone pyrometer 257, with each represented in FIG. 2 by a corresponding sensor area or spot that would be monitored on an upper surface of the wafer 220 during their operations to sense temperatures involving receiving electromagnetic radiation through gaps/spaces between linear lamps in the top or upper lamp bank 238 and emitted from the surface of the wafer (or film developing thereon) and received at the respective pyrometer. As shown, the wafer 220 (or its upper surface) may be divided into three (or more) zones or a center zone 250, a middle zone 254, and an edge zone 256, and temperatures of these zones are monitored by radially positioning a pyrometer in each as shown by sensor areas or spots of pyrometers 251, 255, and 257 wherefrom each of the pyrometers receives electromagnetic radiation emitted by the surface of the wafer (e.g., during heating of the substrate to a desired deposition temperature), by a developing film (e.g., during deposition of an epitaxial film onto the upper surface of the wafer), and/or from a deposited film subsequent to deposition (e.g., during cooling from a predetermined deposition temperature to a temperature suitable for unloading of the wafer from the reaction chamber).

The specific size of each zone and the location of the pyrometer may vary to practice the system 200 as long as the spots/sensor areas fall within the associated zone. For example, a wafer 220 may have a radius of about 150 millimeters (which may be designated as R150 mm), and the zones 250, 254, and 256 may be sized as follows: (a) center zone 250 from wafer center to outer circumference at a radius in the range of about 30 to about 80 millimeters; (b) middle zone 254 from outer circumference of center zone 250 to an outer circumference at a radius in the range of about 60 to about 120 millimeters; and (c) edge zone 256 from outer circumference of the middle zone 254 to an outer circumference at or near the wafer edge 222 (or an outer circumference with a radius in the range of about 145 to about 150 millimeters or the like). Likewise, the specific radial position of the spots of the pyrometers 251, 255, and 257 within these zones 250, 254, and 256 may vary to practice the system 300, and, as shown in FIG. 2, the locations may be chosen, in part, based on the gaps or holes between lamps in the top bank 238. For example, the center zone pyrometer 251 may be positioned to provide the spot/sensor area at a radial offset from the center of the wafer 220 of about 0 to about 40 millimeters, the middle zone pyrometer 255 may be positioned to provide the spot/sensor area at a radial offset from the center of the wafer 220 of about 30 to about 110 millimeters (with about R95 millimeters used in certain examples), and the edge zone pyrometer 257 may be positioned to provide the spot/sensor area at a radial offset from the center of the wafer 220 of about 140 to about 149 millimeters (with about R145 millimeters to about R147 millimeters used in certain examples).

Figure 3:
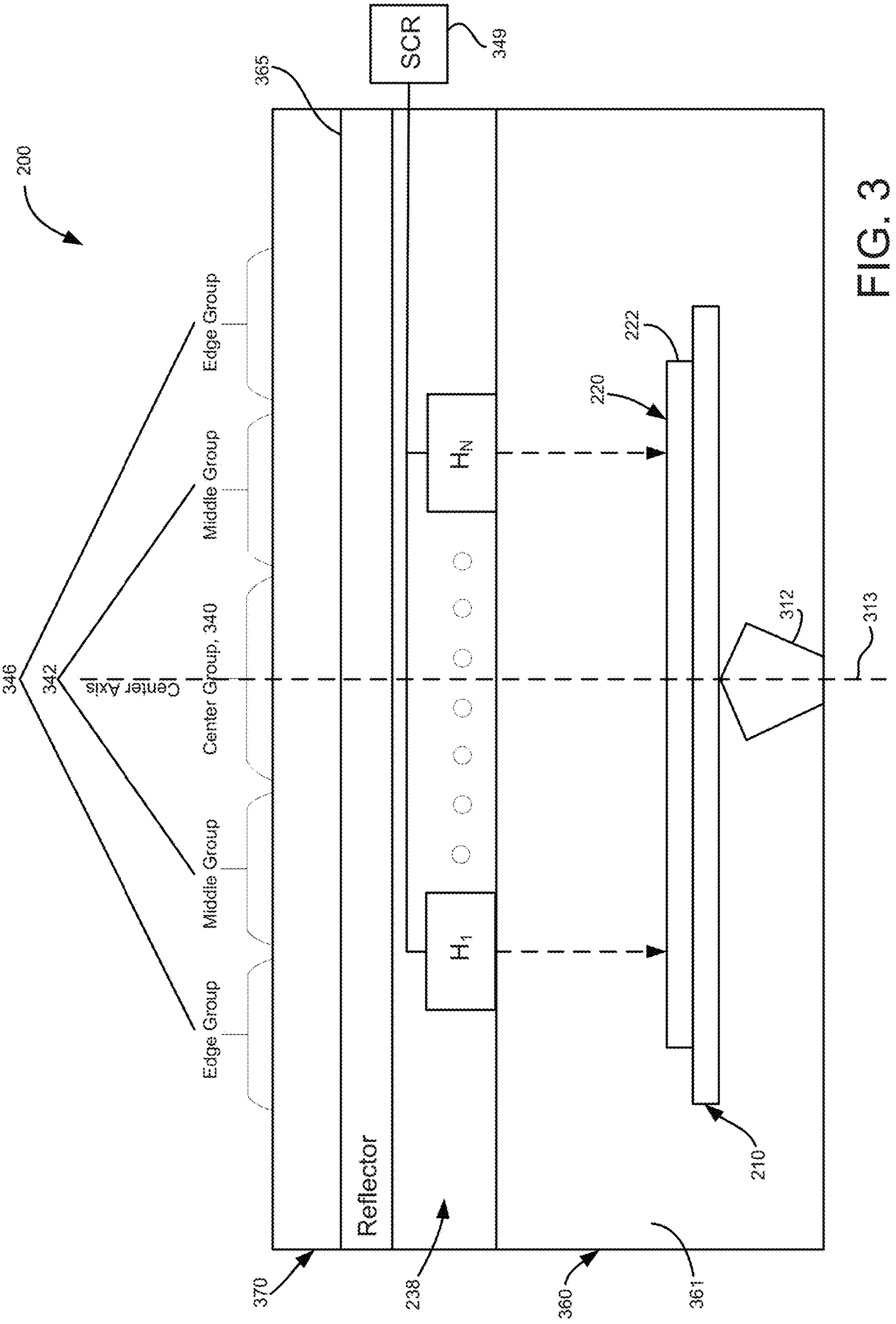
FIG. 3 illustrates a schematic sectional view of a portion of the reactor system of FIG. 2 showing a reaction chamber equipped with a temperature monitoring assembly of the present description.

FIG. 3 illustrates a schematic side view of the reactor system 200 of FIG. 2 providing additional details of the new design. As shown, the wafer 220 is supported upon the susceptor 210 within an inner chamber 361 of a reaction chamber 360. The susceptor 210 is supported upon rotation shaft or pin 312, which is shown to rotate about its center axis (which extends through the center of wafer 220) with arrow 313 so as to rotate the wafer 220 during deposition steps such as during EPI growth or the like. The upper bank or array 238 of heat lamps (numbered 1 to 11 in FIG. 3) are mounted above the inner chamber 361 within a lamp bank 370.

During operations, each lamp is operated to output light/radiant energy to heat the inner chamber 361 and wafer 220 as shown with arrows 339. The power output or amount of heat 339 output can be independent controlled such as through the use of individual lamp control units as shown with switch 349 (for Lamp No. 1) with a silicon controlled rectifier (SCR) shown as an exemplary solid state switch device that may be used to provide fast, infinitely variable proportional control of electric power to each lamp in bank/array 238. Further, as discussed herein, the lamps of the array/bank 238 (and bottom or lower array/bank 234 of FIG. 2) may be divided into or assigned to control zones and be controlled concurrently as sets/units based on real-time temperature feedback from pyrometers in those physical zones (e.g., pyrometers mounted on lamp bank 370 within or between lamps of the same heating or control zones).

In this particular, but non-limiting, example, the lamp array/bank 238 is divided into three groups or control zones that correspond with the three zones or areas 250, 254, 256 of the wafer 220 (shown in FIG. 2), and these are the center group 340 (made up of the center three lamps), the middle group 342 (made up of two pairs of lamps on either side (or opposite sides) of the center group 340), and the edge group 346 (made of two pairs of lamps on either side (or opposite sides) of the middle group 342). The number and location of the lamps in each group 340, 342, 346 may vary with it generally being preferable that lamps in each group are chosen based on the portion or area of the wafer 220 that they heat during operations (e.g., assign lamps that heat the edge 222 of the wafer 220 to the edge group 346 and so on).

In the examples of FIGS. 2 and 3, the system 200 is adapted to provide 3-zone wafer temperature control for an existing lamp bank design (i.e., lamp banks employed during epitaxial growth at atmospheric pressure or reduced pressure) with twenty-two linear lamps. As shown, the linear lamps were separated into three groups (i.e., center, middle, and edge groups 340, 342, and 346 in FIG. 3), and the lamps of lower and upper banks/arrays 234, 238 may be operated using three closed-loop proportional-integral-derivative (PID) control or other control approaches. Three pyrometers 251, 255, and 257 may be used to measure wafer center, middle, and edge zone temperatures, which are provided as feedback to the controller to actuate the power of the three groups 340, 342, 346. Inside of each group 340, 342, 346, there are multiple linear lamps, and a power ratio can be assigned to each linear lamp as an open-loop lamp power control, e.g., using an SRC, with SCR 349 shown in FIG. 3 as an example for Lamp No. 1 of edge group 346. In this manner, each lamp's power is controlled by SCR to achieve accurate and repeatable lamp power control.

Figure 4A:
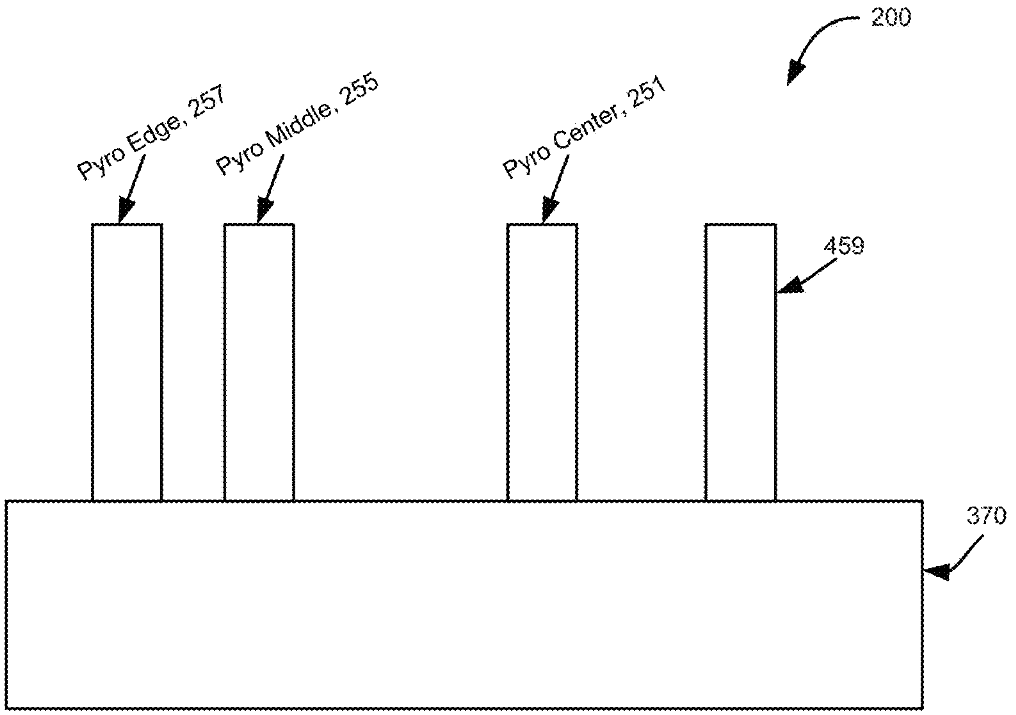
FIGS. 4A and 4B illustrate a side elevation and a top perspective view of the reactor system of FIGS. 2 and 3 showing one implementation of the temperature monitoring assembly including four temperature sensors (e.g., pyrometers).
Figure 4B:
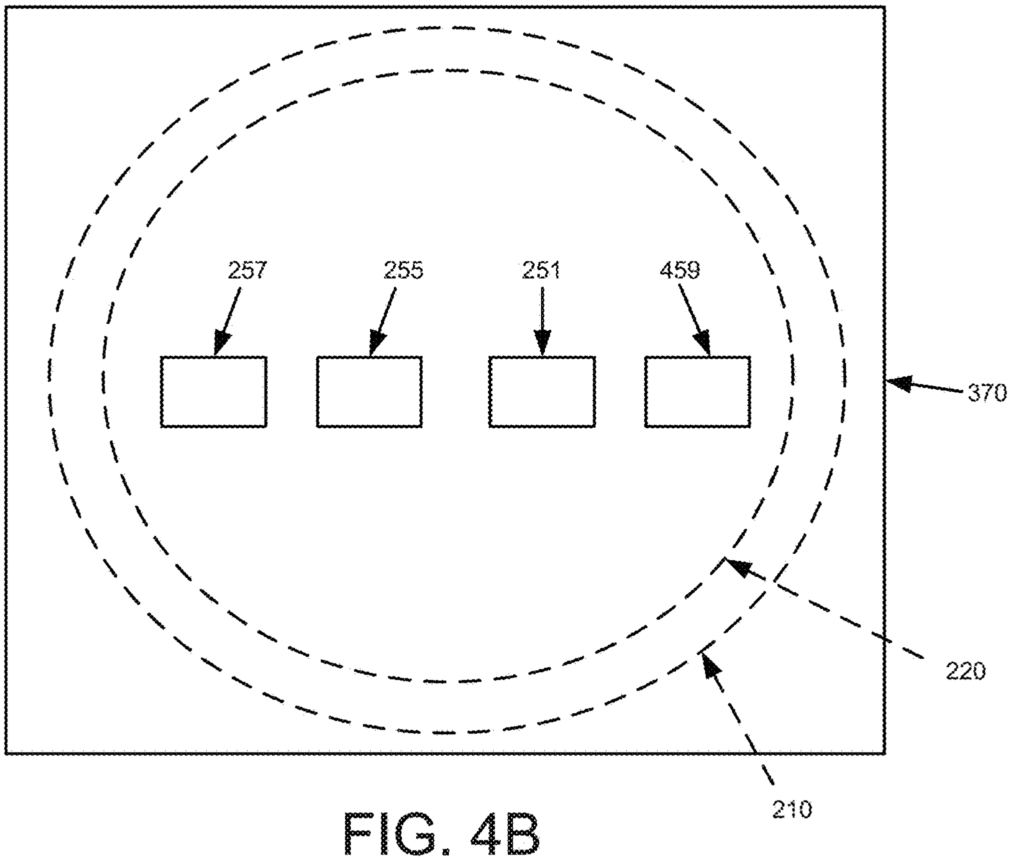

FIGS. 4A and 4B illustrate a side elevation view and a top perspective view of the reactor system 200 of FIGS. 2 and 3 showing one implementation of the temperature monitoring assembly including four temperature sensors (e.g., IR pyrometers or the like). As shown, the system 200 includes a pyrometer 450 to sense temperatures of the material forming reaction chamber (element 360 in FIG. 3), e.g., a quartz material forming an upper wall of the reaction chamber. Further, the system 200, or its temperature monitoring assembly, includes three pyrometers for monitoring the three wafer zones 250, 254, 256 shown in FIG. 2.

Particularly, as shown, the system 200 includes a center pyrometer 251, a middle pyrometer 255, and an edge pyrometer 257 positioned and mounted on the lamp bank 370 to receive electromagnetic radiation from the spots shown in FIG. 2 in zones 250, 254, and 256, respectively. The pyrometers 251, 255, and 257 are provided in the reactor system 200 so that electromagnetic radiation emitted by the wafer from each of the zones is received at one of the pyrometers 251, 255, and 257 through (or the pyrometer is looking through) the lamp bank 370 (as well as holes in a reflector in most cases) opening such that the pyrometers 251, 255, and 257 measure wafer temperature within each of the three zones 250, 254, and 256, respectively, with the specific radial position or offset of each pyrometer often being chosen to suit the gaps between heat lamps and/or to match other openings/channels between the lamp bank 370 and the inner chamber 361 where wafer 220 is positioned on susceptor 210.

Figure 5:
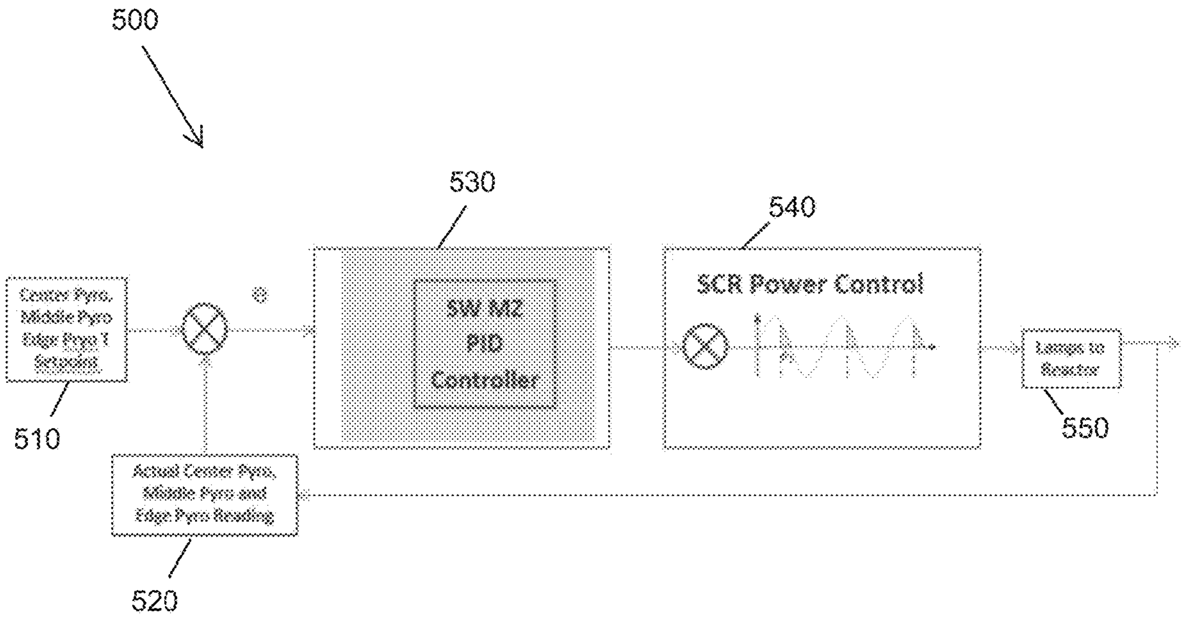
FIG. 5 is a functional box or schematic illustration of a control system for a reactor system that is adapted to operate a set of heat lamps to control wafer temperature gradients.

FIG. 5 is a functional box or schematic illustration of a control system 500 for a reactor system (such as the systems of FIGS. 2-4) that is adapted to operate a set of heat lamps to control wafer temperature gradients. As shown, a controller 530 (which may have a processor running code or instructions (or software) to provide the functions described herein) takes as input the temperature setpoints for the wafer-monitoring temperature sensors of the temperature monitoring assembly. In the example of FIGS. 2-4, temperature setpoints 510 (which may be stored in memory accessible by the controller 530) may be provided for the center pyrometer, the middle pyrometer, and the edge pyrometer. These setpoints 510 may be the same to provide temperature uniformity (or only a small temperature gradient) across a wafer or may differ from each other (or two may be the same) to achieve a desired temperature gradient (e.g., a non-zero gradient falling in a predefined range). The controller 530 also takes as input actual readings or temperatures from the temperature sensors (e.g., center, middle, and edge pyrometers).

The controller 530 compares the actual wafer temperatures 520 to the setpoints 510 for each pyrometer or zone, and, in response, the controller 530 generates control signals that are provided to the power controller or controllers (e.g., SCR for each linear lamp) 540 for the lamps 550 of the reaction chamber. The control signals, in some cases, are designed to power each lamp of a group in a like manner, e.g., all lamps in the edge group are powered in a matching manner and so on. FIG. 5 shows that the power control 540 provides SCR power control to lamps 550 so as to provide electric power to the lamps 550 in manner that is fast, infinitely variable proportional based on feedback 520 from the pyrometers of the zones of the wafer being monitored. Although shown and described herein as having three pyrometers; i.e., a center pyrometer, an edge pyrometer arranged radially outward of the center pyrometer, and an intermediate pyrometer arranged radially between the center pyrometer and the edge pyrometer; it is to be understood that examples of the present disclosure can have additional pyrometers at different radial offsets between the center pyrometer and the edge pyrometer. As will be appreciated by those of skill in the art in view of the present disclosure, such examples can provide gradient control, for example, when temperature variation across the wafer surface has higher order shape, the four or more pyrometers in such examples providing additional temperature information for fitting a higher order polynomial function to the four or more radially separated temperature measurements.

The control system 500 provides a reactor system with 3-zone closed-loop control of wafer temperatures. This is achieved, in part, with the software controller 530, which sets SCR power 540 to power the corresponding lamp(s) 550, and, thus, controls the wafer temperature gradient. For example, with reference to FIG. 3, Lamp No. 1 is in the edge group 346, and its power is controlled by SCR #1 (labeled as item 349 in FIG. 3). The power setpoint to SCR #1 may be stated as:

$$P\_\text{setpoint(SCR \#1)}=\%\ P\text{output(PyroEdge)*Ratio (SCR \#1)}$$

where "output(PyroEdge)" is real-time power calculated from a PID algorithm with closed-loop temperature control run by controller 530 and "Ratio(SCR #1)" is the ratio setpoint inside the edge group 346 as open-loop control.

In certain examples, the control system 500 may control wafer temperature according temperature variation between the center zone and the edge zone of the wafer. For example, the control system 500 may calculate a differential between a center zone temperature reported by the center pyrometer and an edge zone temperature reported by the edge pyrometer, compare the calculated differential to a predetermined center-to-edge temperature limit, and increase or decrease power to the lamps assigned to either (or both) the center and edge zones when the calculated differential exceeds the predetermined center-to-edge temperature limit. As will be appreciated by those of skill in the art in view of the present disclosure, this can limit variation within the film deposited onto the wafer, e.g., by improving film thickness uniformity across the wafer.

In accordance with certain examples, the control system 500 may control wafer temperature according to temperature gradient between the center zone and the edge zone using the middle zone temperature. In this the control system may fit a curve to the temperatures reported by the center pyrometer, the middle pyrometer, and the edge pyrometer—and thereafter determine a maximum slope (or gradient) at each point along the curve. The control system 500 may thereafter compare the determined maximum gradient to a predetermined gradient limit, and thereafter increase or decrease power to one or more lamps within the center zone, the middle zone, and/or the edge zone according to the location (i.e. zone) of the determined maximum gradient when the determined gradient exceeds the predetermined gradient limit. As will be appreciated by those of skill in the art in view of the present disclosure, controlling temperature according to gradient allows for limiting (or eliminating) crystallographic slip otherwise associated with cross wafer temperature gradient—during film deposition as well as cool down subsequent to film deposition.

Figure 6:
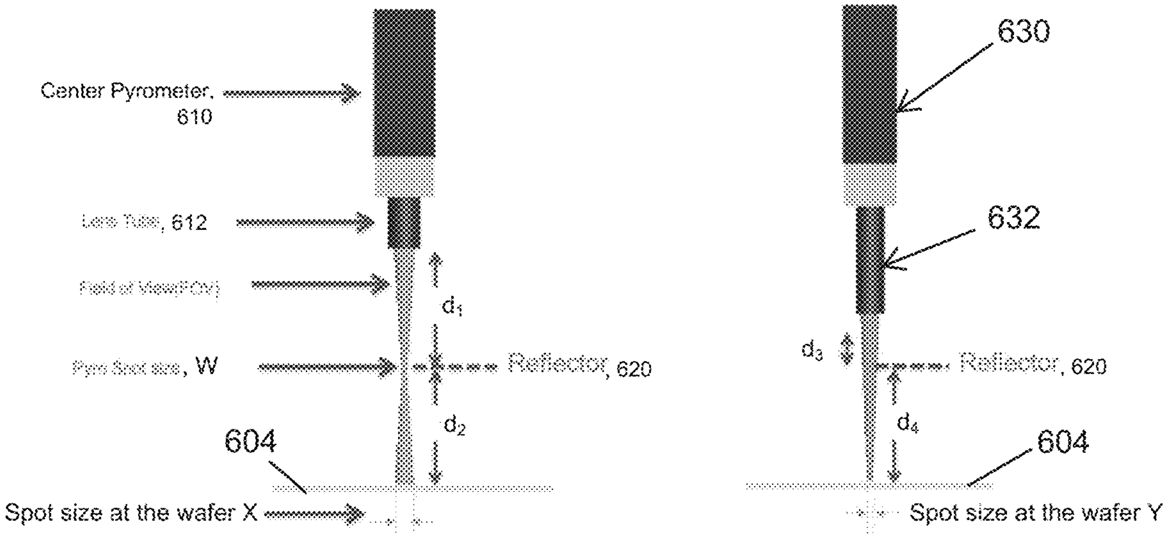
FIG. 6 is a side view of a center (and/or middle) pyrometer and an edge pyrometer for use in a temperature monitoring assembly of the present description to achieve differing spot sizes.

FIG. 6 is a side view of a center (and/or middle) pyrometer 610 and an edge pyrometer 630 for use in a temperature monitoring assembly of the present description to achieve differing spot sizes. Particularly, the inventors recognized that a new edge pyrometer design may be used to reduce spot size at a wafer 604 to enhance far edge temperature measurement. Far edge temperature measurement and its temperature control (based on feedback to the heater controller from the far edge (or edge zone) pyrometer) is highly useful in controlling wafer edge slip. Wafer temperature gradient is typically larger at the wafer edge and its bevel area, which leads to bigger thermal stress, and it has been observed that most of the slip formation is on the wafer edge.

As shown in FIG. 6, a center (and middle) pyrometer 610 may receive electromagnetic radiation emitted from the wafer from within the zone underlying the pyrometer at its lens tube 612 according to, based on its field of view (fov) and working distance and relative location of the reflector 620 and wafer 604, a spot size on the wafer 604 in the range of about 15 to about 25 millimeters (with about 20 millimeters shown in FIG. 6 as one example). More particularly, the reflector 620 is placed equidistant from an outlet of the lens tub 612 and from the wafer 604 (or its upper surface), e.g., with a working distance of about 250 millimeters the outlet of the tube 612 is about 125 millimeters from the reflector 620 and the wafer 604 is about 125 millimeters from the reflector. The resultant spot from which the edge pyrometer 610 (and middle pyrometer in some cases) received electromagnetic radiation emitted by the wafer surface (and/or developing/deposited film) may be in the range of about 15 to about 25 millimeters (such as about 20 millimeters), which may be at the center of the wafer 604 or some offset from the wafer edge to be center zone (or middle zone) such as at about 138 millimeters offset from the edge with a wafer having a radius of 150 millimeters.

For the edge pyrometer 630, a tube 632 with a longer length is utilized to reduce the working distance and achieve a spot size to have a radius in the range of about 2 to about 10 millimeters, with a spot with having a width (e.g., a radius) of about 5 to about 6 millimeters being used in one example of the pyrometer 630. The length of the lens tube 632 is shown in FIG. 6 to be selected such that a lens element supported in the distal end of the lens tube 632 is much closer to the reflector 620 than for tube 612 of the center pyrometer. For example, this separation distance may be in the range of about 25 to about 35 millimeters with about 30 millimeters shown, while retaining the reflector-to-wafer distance (e.g., a distance of about 125 millimeters), and as consequence the pyrometer 630 receives electromagnetic radiation from a spot on the wafer surface (and/or developing/deposited film) with an outer diameter of about 6 millimeters. With this edge pyrometer arrangement, the edge pyrometer can be moved (along with its output sensor area or spot) to a location close to the wafer edge (e.g., to a radial offset from the wafer center in the range of about 140 to about 150 millimeters such as about 145 millimeters in one useful design) for a better far edge temperature control. In other examples, the working distance is set by lowering the pyrometer 630 within the lamp bank to place the tube outlet closer to the reflector 620 and wafer 604, while other examples may utilize optical assemblies to achieve the reduced working distance and smaller spot size shown in FIG. 6 of about 6 millimeters or less in outer diameter.

Figure 7:
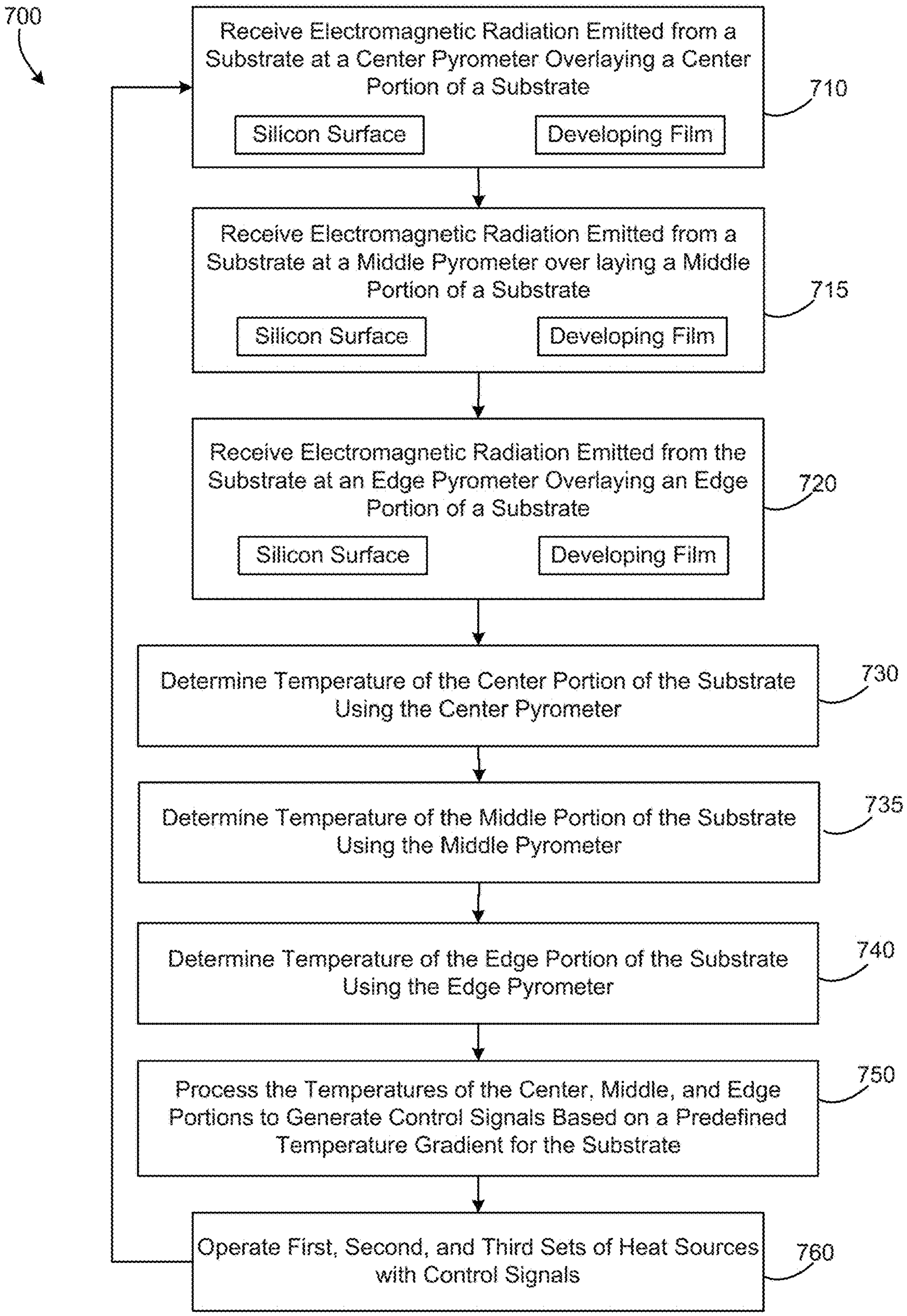
FIG. 7 is a method of operating a reactor system to provide wafer temperature gradient control according to an example of the present description.

FIG. 7 is a method 700 of operating a reactor system (such as system 200 in FIGS. 2 and 3 using a processor and program modules to perform one or more of the steps of the method 900) to provide wafer temperature gradient control according to an example of the present description. The method 700 may start with providing a substrate, such as one with a silicon surface, in a reaction chamber with a wafer temperature gradient control as described herein. The reaction chamber may then be used to perform deposition processes that provide a developing film.

At step 710, the method 700 may include receiving electromagnetic radiation with a center pyrometer overlaying a center portion of a substrate or wafer. This radiation is emitted from the substrate (or a film developing on a surface of the substrate). At step 715, the method 700 may include receiving electromagnetic radiation with a middle pyrometer overlaying a middle portion of the substrate. Again, this radiation is emitted from the substrate (or a film developing on a surface of the substrate). At step 720, the method 700 may include receiving electromagnetic radiation with an edge pyrometer overlaying an edge portion of the substrate, and this radiation is emitted from the substrate (or a film developing on a surface of the substrate).

The method 700 continues with steps 730, 735, and 740 with using the center, middle, and edge pyrometers to determine temperatures at the center, middle, and edge of the substrate using the center, middle, and edge pyrometers. Then, at step 750, the method includes processing, with a controller and its program modules, the temperatures of the center, middle, and edge portions or zones of the substrate, and, in response, generating control signals based on a predefined temperature gradient (e.g., a value stored in memory accessible by the processor) for the substrate (e.g., for a particular deposition process performed with the reaction chamber). Then, at step 760, the method 700 includes, based on or using the control signals, to operate first, second, and third sets of heat sources (e.g., lamps or the like) to control the temperature variation or differential from the center to the edge of the substrate. The method 700 may then continue with step 710 until the process is completed or temperature control is no longer required.

In some examples of the method 700, the predefined temperature gradient for the substrate is defined by setpoint temperatures for the center, middle, and edge portions or zones of the substrate. The processing of the temperatures by the controller may include closed-loop control that can involve comparing the temperature of the center, middle, and edge portions or zones read by the center, middle, and edge pyrometers (or other temperature sensors) with the setpoint temperatures. Also, the operating of the heat sources may include providing variable proportional control over electric power provided to each heat source (e.g., lamp) in the first, second, and third sets of heater lamps based on the control signals.

The inventors further recognized that susceptor concavity (measured as the distance between the susceptor ledges 122 to the lowest point on the susceptor pocket 140 as can be seen in FIG. 1) may impact the temperature gradient between the wafer center and the wafer edge. This is because the wafer edge is directly in contact with the susceptor ledge but not at the wafer center, which results in different heat transfer across the wafer. With the same lamp top and bottom power bias, the bigger concavity the susceptor has the bigger the temperature gradient (or delta T from center to edge) is, which can lead to smaller slip windows.

Reactor systems of the present description (such as reactor system 200 of FIG. 2) may be designed and fabricated to have lower susceptor concavity. For example, susceptor 210 may have a concavity in the range of about 0.15 to about 0.30 millimeters, with certain examples having a susceptor 210 with a concavity in the range of about 0.20 to about 0.25 millimeters as compared with about 0.45 millimeter concavity in some prior susceptor designs. This reduced concavity was shown in testing to better optimize center-to-edge temperature differences (i.e., reduce this difference) but also to reduce the risk that the wafer center will directly touch the top surface of the susceptor when wafer warping in high temperature processes.

The software program used to implement the controller 530 in FIG. 5 may be varied to achieve desired functionality including providing wafer temperature gradient control to reduce slip formation during EPI growth. Overall, several factors may have an impact on slip formation during EPI growth processes. The slip window is a function of EPI growth thickness, deposition temperature, and center-to-edge delta T during ramp and during deposition as shown in the following equation:

$$\text{Slip}=f(\text{thickness},\text{dep\_}T,\text{Delta}T\text{\_dep},\text{Delta}T\text{\_ramp})$$

Generally, the thicker the layer being grown the harder it is to provide it in a slip free manner. Similarly, the higher the deposition temperature used the smaller the slip window. 3-zone wafer temperature control, as described above, allows real-time, closed-loop control of wafer temperature gradients during each process stage, including the ramp-up stage, the main deposition stage, and the ramp-down stage, to suppress dislocation sources for slip formation, to suppress slip nucleation during deposition, and to prevent propagation of the dislocation band.

For example, the wafer temperature gradient can be accurately controlled to remain within a predefined range (e.g., less than a predefined delta T) during the wafer temperature ramp-up stage where substrate temperature is heated up to deposition temperature after the wafer is transferred onto the susceptor and also while wafer deposition step is performed (note, the allowable delta T may vary or be the same for differing process stages/steps). As a result, the new multi-zone temperature monitoring and control approach can lead to a slower ramp rate to produce less over-shoot than in alternative temperature control arrangements, for example, in arrangements where a pyrometer observes the underside of the susceptor or a thermocouple in intimate mechanical contact with the underside of the susceptor, which allows the temperature delta in the transient stage to be minimized or at least reduced. In another working case, more ARC being applied can mean more top power bias, and, consequently, the slip will be less impacted by the susceptor.

Disclosed herein, according to various examples, is a reactor system or apparatus, and associated heating or temperature control methods associated with operations of such a reactor system, for use in semiconductor processing such as chemical vapor deposition (CVD) and other deposition steps. The reactor system is designed to provide accurate monitoring of wafer (or substrate) temperatures during deposition steps including real-time temperature gradient monitoring and control to suppress slip formation especially during high-temperature EPI growth.

Specifically, to control slip, the inventors recognized that it would be beneficial to design a reactor system or tool capability that provides real-time temperature gradient control between a wafer center and a wafer edge during the whole deposition process (e.g., EPI growth) to reduce slip formation. Such temperature gradient control is particularly useful at a far wafer edge, where local temperature gradients can be much higher and where slip formation can be much more prevalent in wafer manufacture. Further, the inventors understood that it was highly desirable to control heating and temperatures to suppress slip nucleation to prevent the propagation of the dislocation in the slip band into the wafer in the whole process, and it was determined that this could be achieved by minimizing the temperature gradient in key process steps including during the wafer temperature ramp up stage in preparation of deposition, during EPI deposition/growth, and during wafer ramp down after wafer deposition.

Wafer temperature measurement techniques employed in some reactor systems for epitaxial film deposition may lack sufficient accuracy. Without being bound by a particular theory, applicant believes that insufficient accuracy may arise, at least in part, because of the delay associated inferring wafer temperature using heat telegraphed through the susceptor, such as by using a susceptor-mounted thermocouple or a pyrometer observing the underside of the susceptor, instead of measuring actual wafer surface temperature in real time. This is because the translation of susceptor temperature to wafer temperature can be established at a certain point of the wafer (e.g. center) but the same translation cannot be used for other points of the wafer since the contact between wafer and susceptor might be not uniform and because of reactor flow dynamics that can cause different convection at different points of the wafer.

In the systems and methods described herein, real-time temperature control across the entire surface of the wafer is provided, i.e., the capability to control temperature at each point on the surface of the wafer (and/or the developing film thereon), and thereby film properties in all regions of the wafer. In certain examples, the present disclosure provides the capability to not only measure/monitor the actual wafer temperature but to control it to less than 0.1 C in all regions of the wafer. This in turns allows for sub-monolayer thickness control in all regions of the wafer and for all wafers which provide much higher device yield and performance for technologies below 3 nm node. Furthermore, this same technique can be used to eliminate slips during both deposition and temperature ramp-ups and ramp-downs in epi processing.

Benefits, other advantages, and solutions to problems have been described herein with regard to specific examples. However, the benefits, advantages, solutions to problems, and any elements that may cause any benefit, advantage, or solution to occur or become more pronounced are not to be construed as critical, required, or essential features or elements of the disclosure.

Reference throughout this specification to features, advantages, or similar language does not imply that all of the features and advantages that may be realized with the present disclosure should be or are in any single examples of the invention. Rather, language referring to the features and advantages is understood to mean that a specific feature, advantage, or characteristic described in connection with an examples is included in at least one example of the subject matter disclosed herein. Thus, discussion of the features and advantages, and similar language, throughout this specification may, but do not necessarily, refer to the same example.

Furthermore, the described features, advantages, and characteristics of the disclosure may be combined in any suitable manner in one or more example. One skilled in the relevant art will recognize that the subject matter of the present application may be practiced without one or more of the specific features or advantages of a particular example. In other instances, additional features and advantages may be recognized in certain examples that may not be present in all examples of the disclosure. Further, in some instances, well-known structures, materials, or operations are not shown or described in detail to avoid obscuring aspects of the subject matter of the present disclosure. No claim element is intended to invoke 35 U.S.C. 112(f) unless the element is expressly recited using the phrase "means for."

The scope of the disclosure is to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. Further, the term "plurality" can be defined as "at least two." As used herein, the phrase "at least one of", when used with a list of items, means different combinations of one or more of the listed items may be used and only one of the items in the list may be needed. The item may be a particular object, thing, or category. Moreover, where a phrase similar to "at least one of A, B, and C" is used in the claims, it is intended that the phrase be interpreted to mean that A alone may be present in an example, B alone may be present in an example, C alone may be present in an example, or that any combination of the elements A, B and C may be present in a single example; for example, A and B, A and C, B and C, or A, B, and C. In some cases, "at least one of item A, item B, and item C" may mean, for example, without limitation, two of item A, one of item B, and ten of item C; four of item B and seven of item C; or some other suitable combination.

All ranges and ratio limits disclosed herein may be combined. Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Any reference to attached, fixed, connected or the like may include permanent, removable, temporary, partial, full and/or any other possible attachment option. Additionally, any reference to without contact (or similar phrases) may also include reduced contact or minimal contact. In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

Although examples of the present disclosure are set forth herein, it should be appreciated that the disclosure is not so limited. For example, although reactor systems are described in connection with various specific configurations, the disclosure is not necessarily limited to these examples. Various modifications, variations, and enhancements of the system and method set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof

What is claimed is:

1. A method of operating a reactor system to provide wafer temperature gradient control, comprising:

operating a center temperature sensor, a middle temperature sensor, and an edge temperature sensor to sense a temperature of a center zone of a wafer on a susceptor in a reaction chamber of the reactor system, to sense a temperature of a middle zone of the wafer, and to sense a temperature of an edge zone of the wafer, respectively, wherein the sensed temperatures of the center zone, the middle zone, and the edge zone of the wafer are from a surface of the wafer upon which a material is to be deposited;

with a controller, processing the temperatures of the center, middle, and edge zones of the wafer to generate control signals based on a predefined temperature gradient for the wafer; and operating, based on the control signals, a first set of heater lamps based on the temperature of the center zone to heat the center zone of the wafer, a second set of heater lamps based on the temperature of the middle zone to heat the middle zone of the wafer, and a third set of heater lamps based on the temperature of the edge zone to heat the edge zone of the wafer, wherein the center, middle, and edge temperature sensors each comprise a pyrometer receiving thermal radiation from respective spots on the surface of the wafer to sense the center, middle, and edge zone temperatures, wherein the spot associated with the edge temperature sensor is smaller than at least one of the spot associated with the center temperature sensor or the spot associated with the middle temperature sensor.

2. The method of claim 1, wherein the pyrometer comprised in at least one of the center temperature sensor or middle temperature sensor comprises a lens tube having a lens tube outlet, wherein the lens tube outlet is positioned such that a reflector in the reactor system is disposed equidistant from the lens tube outlet and the wafer.

3. The method of claim 2, wherein, at least one of:

the pyrometer comprised in the edge temperature sensor comprises a lens tube that is longer than the lens tube of at least one of the center temperature sensor or the middle temperature sensor; or a lens tube outlet of the pyrometer comprised in the edge temperature sensor is disposed closer to the reflector than to the wafer.

4. The method of claim 1, wherein the spot associated with the center temperature sensor has a center point that is radially offset from the center of the wafer, wherein the spot associated with the edge temperature sensor has a center point that is radially offset from the edge of the wafer, and wherein the spot associated with the middle temperature sensor has a center point at a location on the wafer disposed between the spots associated with the center and edge temperature sensors.

5. The method of claim 1, wherein the predefined temperature gradient for the wafer is defined by setpoint temperatures for the center, middle, and edge zones of the wafer.

6. The method of claim 5, wherein the processing of the temperatures by the controller comprises closed-loop control including comparing the temperatures of the center, middle, and edge zones read by the center, middle, and edge temperature sensors with the setpoint temperatures.

7. The method of claim 6, wherein the operating of the heater lamps includes providing variable proportional control over electric power provided to each lamp in the first, second, and third sets of heater lamps based on the control signals.

8. The method of claim 1, wherein the first set of heater lamps comprises three center linear lamps in an upper lamp bank, wherein the third set of heater lamps comprises two pair of outer linear lamps in the upper lamp bank, wherein the second set of heater lamps comprises linear lamps in the upper lamp bank disposed between the linear lamps in the first and third sets of heater lamps, and wherein the linear lamps within each of the first, second, and third sets are provided matching levels of electric power based on the control signals.

9. A reactor system for providing wafer temperature gradient control, comprising:

a reaction chamber;

in the reaction chamber, a susceptor for supporting a wafer;

a plurality of heat lamps operable to direct heat into the reaction chamber and onto the wafer;

a temperature monitoring assembly comprising at least three pyrometers directed toward a surface of the wafer upon which a material is to be deposited, wherein the at least three pyrometers are configured to read temperatures in a center zone, a middle zone, and an edge zone of the surface of the wafer, wherein the temperature monitoring assembly comprises:

an edge pyrometer configured to receive thermal radiation emitted from an edge sensor spot in the edge zone on the surface of the wafer;

a center pyrometer configured to receive thermal radiation emitted from a center sensor spot in the center zone on the surface of the wafer; and a middle pyrometer configured to receive thermal radiation emitted from a middle sensor spot in the middle zone on the surface of the wafer, wherein the edge sensor spot is smaller than at least one of the center sensor spot or the middle sensor spot; and a controller configured to control the plurality of heat lamps based on the temperatures of the center, middle, and edge zones to control a temperature gradient from a center to an edge of the wafer.

10. The reactor system of claim 9, wherein at least one of the center pyrometer or the middle pyrometer comprises a lens tube having a lens tube outlet, wherein the lens tube outlet is positioned such that a reflector in the reactor system is disposed equidistant from the lens tube outlet and the wafer.

11. The reactor system of claim 10, wherein, at least one of:

the edge pyrometer comprises a lens tube that is longer than the lens tube of at least one of the center pyrometer or the middle pyrometer; or a lens tube outlet of the edge pyrometer is disposed closer to the reflector than to the wafer.

12. The reactor system of claim 9, wherein the edge sensor spot is radially offset from the edge of the wafer by 1 to 10 mm.

13. The reactor system of claim 9, wherein the controller generates control signals to provide electric power to a first set of the heat lamps to heat the center zone of the wafer, a second set of the heat lamps to heat the middle zone of the wafer, and a third set of the heat lamps to heat the edge zone of the wafer.

14. The reactor system of claim 13, wherein the control signals set levels of the electric power provided to the first, second, and third sets of the heat lamps based on a comparison of the temperatures in the center zone, the middle zone, and the edge zone of the wafer to setpoint temperatures for the center zone, the middle zone, and the edge zone of the wafer.

15. The reactor system of claim 13, wherein the first set of heat lamps comprises three center linear lamps in an upper lamp bank, wherein the third set of heat lamps comprises two pair of outer linear lamps in the upper lamp bank, wherein the second set of heat lamps comprises linear lamps in the upper lamp bank disposed between the linear lamps in the first and third sets of heat lamps, and wherein differing levels of electric power are provided to at least the first and third sets of heat lamps to control the temperature gradient.

16. A reactor system for providing wafer temperature gradient control, comprising:

a susceptor for supporting a wafer;

a plurality of heat lamps operable to heat the wafer;

a temperature monitoring assembly comprising a center pyrometer, a middle pyrometer, and an edge pyrometer for sensing, respectively, a temperature in a center zone of the wafer, a temperature in a middle zone of the wafer, and a temperature in an edge zone of the wafer, wherein the temperature monitoring assembly is configured to sense the temperatures of the center zone, the middle zone, and the edge zone on a surface of the wafer upon which a material is to be deposited, wherein the edge pyrometer is configured to receive thermal radiation emitted from an edge sensor spot in the edge zone on the surface of the wafer, wherein the center pyrometer is configured to receive thermal radiation emitted from a center sensor spot in the center zone on the surface of the wafer, and wherein the middle pyrometer is configured to receive thermal radiation emitted from a middle sensor spot in the middle zone on the surface of the wafer, wherein the edge sensor spot is smaller than at least one of the center sensor spot or the middle sensor spot; and a controller operating the plurality of heat lamps based on the temperatures of the center, middle, and edge zones to control a temperature gradient from a center to an edge of the wafer, wherein during the operating, the controller generates control signals to independently operate a first set of the heat lamps to heat the center zone of the wafer, a second set of the heat lamps to heat the middle zone of the wafer, and a third set of the heat lamps to heat the edge zone of the wafer.

17. The reactor system of claim 16, wherein the control signals are configured to proportionally set amounts of electric power provided to the first, second, and third sets of the heat lamps based on a comparison of the temperatures in the center zone, the middle zone, and the edge zone of the wafer to setpoint temperatures for the center zone, the middle zone, and the edge zone of the wafer.

18. The reactor system of claim 16, wherein at least one of the center pyrometer or the middle pyrometer comprises a lens tube having a lens tube outlet, wherein the lens tube outlet is positioned such that a reflector in the reactor system is disposed equidistant from the lens tube outlet and the wafer.

19. The reactor system of claim 18, wherein, at least one of:

the edge pyrometer comprises a lens tube that is longer than the lens tube of at least one of the center pyrometer or the middle pyrometer; or a lens tube outlet of the edge pyrometer is disposed closer to the reflector than to the wafer.

20. The reactor system of claim 16, wherein the edge sensor spot is radially offset from the edge of the wafer by 1 to 10 mm.

* * * * *